Oct. 26, 1965 A. VAN DYCK ETAL 3,214,651

SEMICONDUCTOR DEVICE BASE ELECTRODE ASSEMBLY
AND PROCESS FOR PRODUCING THE SAME

Filed Oct. 27, 1961

WITNESSES:

Bernard R. Gieguer

Raymond F. Majesko

INVENTORS
Arie Van Dyck and
Tibor Csakvari.
BY
Frederick Shapoe
ATTORNEY

United States Patent Office 3,214,651

Patented Oct. 26, 1965

3,214,651
SEMICONDUCTOR DEVICE BASE ELECTRODE ASSEMBLY AND PROCESS FOR PRODUCING THE SAME

Arie Van Dyck and Tibor Csakvari, both of Greensburg, Pa., assignors to Westinghouse Electric Corporation, East Pittsburgh, Pa., a corporation of Pennsylvania Filed Oct. 27, 1961, Ser. No. 148,120
7 Claims. (Cl. 317—234)

The present invention relates to a base electrode assembly for a semiconductor device and a process for producing the same.

Heretofore, in the manufacture of certain semiconductor devices such as diodes, a semiconductor member, such as silicon, is soldered to a base or electrode member consisting of an electrical conductor such as molybdenum and an electrical lead is soldered or brazed to the upper surface of the semiconductor member and an electrical conductor is welded to the lower surface of the base member. In welding electrical leads to the base member, problems have been encountered in that during welding there is a thermal and mechanical shock in a vertical direction which thereby, in many cases, cracks the semiconductor member.

The object of the present invention is to provide a process for producing a component for semiconductor devices, and more particularly a composite base electrode assembly for a semiconductor device provided with a preformed eyelet component united to a large electrode base of a refractory metal, so designed that an electrical lead can be welded to the base member and the thermal and mechanical shock created thereby is distributed primarily in a horizontal instead of a vertical direction without deleterious effect on the semiconductor member.

Another object of the invention is to provide a process for producing a base electrode assembly suitable for use in a semiconductor device by disposing a powdered metal in a forming die, disposing a preformed eyelet having a wide head in an apertured punch member, compressing the powdered metal at a high degree of pressure with the punch member so that the head of the eyelet is embedded in the compacted metal powder and sintering at an elevated temperature so that a unitary integral structure is obtained.

Other objects of the invention will in part be obvious and will in part, appear hereinafter.

In order to more fully understand the nature and objects of the invention, reference should be had to the following detailed description and drawing in which.

In accordance with the present invention and in the attainment of the foregoing objects there is provided a composite base electrode assembly that is particularly useful in producing semiconductor devices and a process for producing the same. More specifically, the electrode base assembly comprises a composite of (1) a solid metal eyelet having a relatively wide flat head and an apertured stem and (2) a consolidated and sintered metal powder compact in which the wide flat head is embedded to its full thickness and bonded therewith. In producing the composite base assembly, metal powder having good electrically and thermally conductive properties is disposed in a forming die having the desired diameter of the base electrode. A preformed electrically and thermally conductive eyelet having an apertured stem disposed on a flanged head portion is disposed in a flat surfaced punch member having an aperture in which the stem fits closely. The apertured stem of the eyelet is placed in the aperture of the punch member with the flanged head portion of the eyelet projecting below the flat surface of the punch. The powder in the forming die is compressed with the punch member at a pressure sufficient to consolidate it into a solid body. During the compression step the flange portion of the eyelet is embedded in the metal powder and after compression the flange remains embedded in the compact upon removal of the punch. The compact is then sintered to provide a unitary integral structure.

The metal powder employed for the body of the compact is chosen on the basis of its good electrical and thermal conductivity as well as its thermal expansion characteristics so that it matches the thermal expansion characteristics of the semiconductor member that is subsequently to be joined to one surface of the finished base assembly. Suitable metal powders are molybdenum, tantalum, tungsten and their base alloys as well as mixtures of two or more.

Preferably the eyelet 10 has a head 14 at least twice the diameter of the stem of the eyelet. The head may be knurled or roughened to enable good bonding to the compact. The eyelet may be shaped by machining a solid bar of suitable material such as tantalum, steel or by die forging of a blank of the solid metal to shape.

Figure 1:
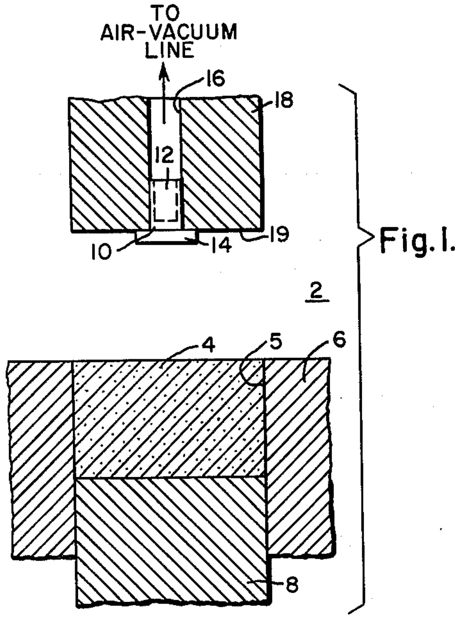
FIGURE 1 is a fragmentary elevation view in cross section of a press in the initial stages of the practice of the invention.

Referring to FIG. 1, there is shown an appaartus 2 used to carry out the process within the teaching of the invention. A measured quantity of powdered metal 4 is fed into a cavity 5 of a die 6, the powder being retained by a punch 8 disposed in the lower end of the cavity. A solid preformed metal eyelet 10, of stainless steel for example, having an apertured stem portion 12 and a wide flanged head 14 is disposed in an aperture 16 of a punch 18 having a flat surface 19 so that the head is flush against the flat surface. The eyelet 10 is held in the aperture of the punch 18 either by friction or by means of a vacuum applied through the aperture 16 at the top of the punch. The vacuum may be controlled by means of a three-way solenoid or a mechanical valve, which allows either a vacuum or room air to enter above the apertured stem of the eyelet when so required.

Figure 2:
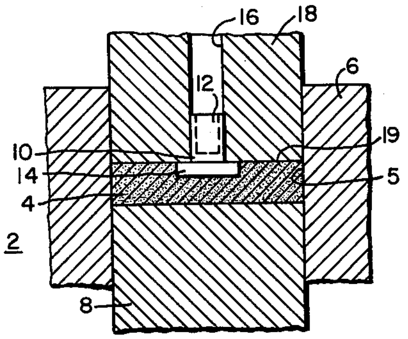
FIG. 2 is a fragmentary elevation view in cross section of the intermediate stage of the practice of the invention.

Referring to FIG. 2, downward movement of punch 18 into the cavity 5 causes the powder 4 to be compressed to conform to surface 19 and the head of eyelet 10. As the punch compresses the powder, the powder flows around the flange 14 of the eyelet 10 and bonds and adheres to it to some extent. The vacuum in aperture 16 may be removed at any time compression of the powder 4 is obtained. Sufficient pressures up to 30 tons per square inch may be applied to consolidate powder 4 and to unite it with the eyelet 10.

Figure 3:
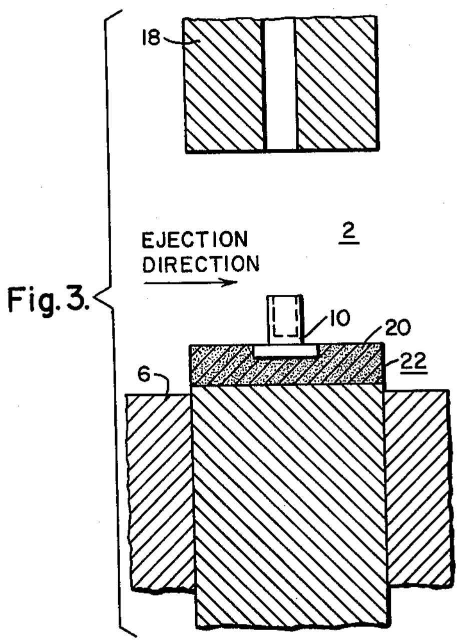
FIG. 3 is a fragmentary elevation view in cross section of the final stage of the practice of the invention.
Figure 4:
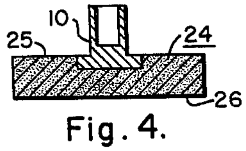
FIG. 4 is a cross section of an electrode assembly.

Referring to FIG. 3, the apertured punch 18 is retracted thus leaving the eyelet 10 embedded in the consolidated powdered compact 20. The bottom punch 8 is then raised in the cavity 5 of the die 6 thereby elevating the powder compact to a position for removal. The consolidated composite assembly 22 is then placed in a furnace and sintered at an elevated temperature. This will cause the eyelet to become integral with the powdered compact since sintering causes both shrinkage and increase in strength of the consolidated powdered compact. The fully sintered composite compact 24 is shown in FIG. 4. The eyelet 12 is centered on the face 25 of the body of the compact. There is good electrical and thermal contact between the eyelet and the compact.

A semiconductor member may be then joined to the flat surface of the base assembly 24 to form a base electrode and an electrical conductor may be soldered to the other face of the semiconductor member to form a counterelectrode. Subsequently, an electrical conductor lead may be welded in the aperture of the stem of the eyelet of the base assembly without damaging the semiconductor member since the mechanical and thermal shock is now in a horizontal direction.

Figure 5:
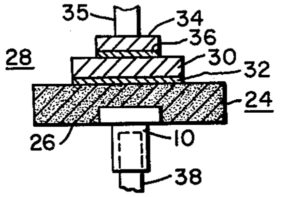
FIG. 5 is a vertical cross section view of a complete semiconductor device.

As shown in FIGURE 5, a semiconductor diode 28 device embodying the base electrode 24 comprises a wafer 30, of silicon for instance, soldered or brazed by a layer 32 of solder to the face 26 of the base electrode 24. A counterelectrode 34 with a lead 35 is soldered to the other face of the wafer 30 by a layer 36 of solder. An electrical lead wire 38 is welded into the aperture 12 of the eyelet 10. Excellent results have been obtained from the use of composite base electrodes of this invention in producing diodes.

The following example is illustrative of the teachings of the invention.

A base assembly was made in accordance with the methods described above. The powdered metal employed was molybdenum and the eyelet was composed of steel. The pressure used to compress the molybdenum powder and to embed the head of the eyelet therein was of the order of four tons for a compact of about ⅜ inch diameter. The compact was then sintered at a temperature of 1600° C. for a period of one hour. A silicon wafer was then soldered to the flat surface of the base assembly and a tantalum lead was soldered to the upper surface of the silicon wafer. A copper nickel alloy lead was then welded within the aperture of the stem of the eyelet. Test results showed that there were no deleterious effects on the silicon wafer.

Similarly, a semiconductor device was fabricated by use of a simple flat molybdenum disk, without an eyelet on one surface of the base portion of the device. A copper-nickel alloy electrical conductor lead was welded directly to the flat surface portion of the molybdenum base and test results indicated that cracks would frequently form in the silicon wafer and cause the device to become useless.

It is intended that the foregoing description and drawings be interpreted as illustrative and not limiting.

We claim as our invention:

1. In the process for producing a base assembly suitable for use in a semiconductor device, the steps comprising disposing a finely divided metal in a forming die, disposing an eyelet having a flat head and an apertured stem in an apertured punch member with the stem being disposed in the aperture thereof, compressing the finely divided metal at a high pressure and sintering the resulting compact at an elevated temperature, the head of the eyelet embedded in said powdered metal to provide a unitary integral structure.

2. In the process for producing a base assembly suitable for use in a semiconductor device, the steps comprising disposing a metal powder consisting of at least one metal of the group consisting of molydenum, tantalum and tungsten and their base alloys in a forming die, disposing a good electrically and thermally conductive metal eyelet having a flat head and a hollow stem with the head in contact with the powder, compressing the powder at a pressure to consolidate it into a compact, the head of the eyelet being embedded in the compacted powder and sintering the resulting body to provide a unitary integral structure.

3. In the process for producing a semiconductor rectifier device, the steps comprising disposing a metal powder consisting of molybdenum in a forming die, partially disposing a good electrically and thermally conductive eyelet having a flat head and an apertured stem in an apertured punch member with the stem being disposed in the aperture thereof, compressing the powder at a high pressure, the head of the eyelet being embedded in the compacted powder, sintering the resulting body to provide a unitary integral structure, joining an electrically conductive lead to one surface of the compacted powder in the apertured stem of the eyelet, joining a semiconductor member to the opposite surface of the compacted powder, joining an electrically conductive lead to the upper surface of the semiconductor member and applying a protective coating to the semiconductor member.

4. A composite base electrode assembly comprising a sintered disk compact of a metal powder selected from at least one of the group consisting of molybdenum, tantalum, tungsten, and their basic alloys, and a solid metal eyelet having a flat head and a hollow stem with the head embedded flush at the center of one face of the disk, the head and compact being metallurgically joined to provide for good thermal and electrical conductivity.

5. A composite base electrode assembly comprising a sintered disk compact consisting of powdered molybdenum and a solid metal eyelet having a flat head and a hollow stem with the head embedded substantially flush in one face of the disk, the head and compact being metallurgically joined to provide for good thermal and electrical conductivity.

6. A semiconductor device comprising a sintered disk compact of a metal powder selected from at least one of the group consisting of molybdenum, tantalum, tungsten and their basic alloys, and a metal eyelet having a flat closed head and a hollow stem with the head embedded flush at the center of one face of the disk, the head and compact being metallurgically joined to provide for good thermal and electrical conductivity, an electrical conductor welded to the hollow stem of the eyelet, a semiconductor element soldered to the other face of said disk and a contact member having an electrical conductor lead attached thereto soldered to the upper surface of the semiconductor element.

7. A semiconductor rectifier device comprising a sintered disk compact consisting of molybdenum and a metal eyelet having a flat head and a hollow stem with the head embedded flush at the center of one face of the disk, the head and compact being metallurgically joined to provide for good thermal and electrical conductivity, an electrical conductor welded to the hollow stem of the eyelet and a semiconductor element soldered to the other face of said disk and a contact member having an electrical conductor lead attached thereto soldered to the upper surface of the semiconductor element.

References Cited by the Examiner

UNITED STATES PATENTS

| | | | |
|---|---|---|---|
| 2,462,906 | 3/49 | Sauerborn | 317—241 |
| 2,908,850 | 10/59 | Knepshield | 317—234 |
| 2,922,092 | 1/60 | Gazzara et al. | 317—240 |
| 2,946,935 | 7/60 | Finn | 317—234 |
| 3,054,029 | 9/62 | Wagner | 317—241 |

DAVID J. GALVIN, *Primary Examiner.*

JAMES D. KALLAM, *Examiner.*